(12) United States Patent
Zhou et al.

(10) Patent No.: US 7,777,516 B2
(45) Date of Patent: Aug. 17, 2010

(54) SYSTEM AND METHOD FOR BEARING FAULT DETECTION USING STATOR CURRENT NOISE CANCELLATION

(75) Inventors: Wei Zhou, Los Angeles, CA (US); Bin Lu, Kenosha, WI (US); Thomas G. Habetler, Snellville, GA (US); Ronald G. Harley, Lawrenceville, GA (US); Peter J. Theisen, West Bend, WI (US)

(73) Assignee: Eaton Corporation, Cleveland, OH (US)

( * ) Notice: Subject to any disclaimer, the term of this patent is extended or adjusted under 35 U.S.C. 154(b) by 148 days.

(21) Appl. No.: 12/132,056

(22) Filed: Jun. 3, 2008

(65) Prior Publication Data
US 2008/0309366 A1   Dec. 18, 2008

Related U.S. Application Data

(60) Provisional application No. 60/932,742, filed on Jun. 4, 2007.

(51) Int. Cl.
*G01R 31/34* (2006.01)
(52) U.S. Cl. .................................. 324/772; 324/158.1
(58) Field of Classification Search ........................ None
See application file for complete search history.

(56) References Cited

U.S. PATENT DOCUMENTS

| | | | |
|---|---|---|---|
| 5,299,650 A | 4/1994 | Wada et al. | |
| 5,726,905 A | 3/1998 | Yazici et al. | |
| 6,593,751 B2 * | 7/2003 | Takahashi | 324/551 |
| 6,727,725 B2 | 4/2004 | Devaney et al. | |
| 7,075,327 B2 | 7/2006 | Dimino et al. | |
| 7,117,125 B2 | 10/2006 | Dimino et al. | |
| 7,231,319 B2 | 6/2007 | Dimino et al. | |
| 7,336,455 B2 | 2/2008 | Dimino et al. | |

(Continued)

FOREIGN PATENT DOCUMENTS

JP    58-021173 A    2/1983

(Continued)

OTHER PUBLICATIONS

Zhou et al., "Incipient Bearing Fault Detection via Stator Current Noise Cancellation using Wiener Filter," Diagnostics for Electric Machines, Power Electronics and Drives, 2007, IEEE International Symposium.

(Continued)

*Primary Examiner*—Paresh Patel
(74) *Attorney, Agent, or Firm*—Ziolkowski Patent Solutions Group, SC

(57) ABSTRACT

A system and method for detecting incipient mechanical motor faults by way of current noise cancellation is disclosed. The system includes a controller configured to detect indicia of incipient mechanical motor faults. The controller further includes a processor programmed to receive a baseline set of current data from an operating motor and define a noise component in the baseline set of current data. The processor is also programmed to repeatedly receive real-time operating current data from the operating motor and remove the noise component from the operating current data in real-time to isolate any fault components present in the operating current data. The processor is then programmed to generate a fault index for the operating current data based on any isolated fault components.

24 Claims, 5 Drawing Sheets

U.S. PATENT DOCUMENTS 7,346,475 B2 3/2008 Dimino et al.

FOREIGN PATENT DOCUMENTS

| KR | 10-2005-0075808 A | 7/2005 |
| KR | 10-2007-0030073 A | 3/2007 |

OTHER PUBLICATIONS

Pallas-Areny, Ramon et al. Sensors and Signal Conditioning Second Edition. Wiley Interscience Publications, 2000, pp. 403-426.
PCT International Search Report and Written Opinion, PCT/US2008/065612, Oct. 14, 2008.

* cited by examiner

SYSTEM AND METHOD FOR BEARING FAULT DETECTION USING STATOR CURRENT NOISE CANCELLATION

CROSS-REFERENCE TO RELATED APPLICATION

The present application claims the benefit of U.S. provisional application Ser. No. 60/932,742, filed Jun. 4, 2007, and which is incorporated herein by reference.

GOVERNMENT LICENSE RIGHTS

The present invention was made at least in part with Government support under Contract No. DE-FC36-04G014000, awarded by the United States Department of Energy. The Government may have certain rights in the invention.

BACKGROUND OF THE INVENTION

The present invention relates generally to motors and, more particularly, to a system and method for detection of incipient conditions indicative of motor faults.

Three-phase induction motors consume a large percentage of generated electricity capacity. Many applications for this "workhorse" of industry are fan and pump industrial applications. For example, in a typical integrated paper mill, low voltage and medium voltage motors may comprise nearly 70% of all driven electrical loads. Due to the prevalence of these motors in industry, it is paramount that the three-phase motor be reliable. Industry reliability surveys suggest that motor failures typically fall into one of four major categories. Specifically, motor faults typically result from bearing failure, stator turn faults, rotor bar failure, or other general faults/failures. Within these four categories: bearing, stator, and rotor failure account for approximately 85% of all motor failures.

It is believed that this percentage could be significantly reduced if the driven equipment were better aligned when installed, and remained aligned regardless of changes in operating conditions. However, motors are often coupled to misaligned pump loads or loads with rotational unbalance and fail prematurely due to stresses imparted upon the motor bearings. Furthermore, manually detecting such fault causing conditions is difficult at best because doing so requires the motor to be running. As such, an operator is usually required to remove the motor from operation to perform a maintenance review and diagnosis. However, removing the motor from service is undesirable in many applications because motor down-time can be extremely costly.

As such, some detection devices have been designed that generate feedback regarding an operating motor. The feedback is then reviewed by an operator to determine the operating conditions of the motor. However, most systems that monitor operating motors merely provide feedback of faults that have likely already damaged the motor. As such, though operational feedback is sent to the operator, it is usually too late for preventive action to be taken.

Some systems have attempted to provide an operator with early fault warning feedback. For example, vibration monitoring has been utilized to provide some early misalignment or unbalance-based faults. However, when a mechanical resonance occurs, machine vibrations are amplified. Due to this amplification, false positives indicating severe mechanical asymmetry are possible. Furthermore, vibration-based monitoring systems typically require highly invasive and specialized monitoring systems to be deployed within the motor system.

In light of the drawbacks of vibration-based monitoring, current-based monitoring techniques have been developed to provide a more inexpensive, non-intrusive technique for detecting bearing faults. There are also limitations and drawbacks to present current-based fault detection. That is, in current-based bearing fault detection, it can be challenging to extract a fault signature from the motor stator current. For different types of bearing faults, fault signatures can be in different forms. According to general fault development processes, bearing faults can be categorized as single-point defects or generalized roughness. Most current-based bearing fault detection techniques currently in use today are directed toward detecting single-point defects and rely on locating and processing the characteristic bearing fault frequencies in the stator current. Such techniques, however, may not be suitable for detecting generalized roughness faults. That is, generalized-roughness faults exhibit degraded bearing surfaces, but not necessarily distinguished defects and, therefore, characteristic fault frequencies may not necessarily exist in the stator current. As many bearing faults initially develop as generalized-roughness bearing faults, especially at an early stage, it would be beneficial for current-based bearing fault detection techniques to be able to detect such generalized-roughness bearing faults.

It would therefore be desirable to design a current-based bearing fault detection technique that overcomes the aforementioned drawbacks. A current-based bearing fault detection technique that allows for detection of generalized-roughness bearing faults would be beneficial, by providing early stage detection of bearing faults.

BRIEF DESCRIPTION OF THE INVENTION

The present invention provides a system and method for detecting impending mechanical motor faults by way of current noise cancellation. Current data is decomposed into a non-fault component (i.e., noise) and a fault component, and noise-cancellation is performed to isolate the fault component of the current and generate a fault identifier.

In accordance with one aspect of the invention, a controller configured to detect indicia of incipient mechanical motor faults includes a processor programmed to receive a set of current data from a motor during known normal operation, define a baseline noise based on the set of current data acquired from the know normal operating motor, and repeatedly receive real-time operating current data from the operating motor. The processor is further programmed to remove the baseline noise from the operating current data to identify any fault components present in the operating current data and generate a fault index for the operating current data based on any isolated fault components.

In accordance with another aspect of the invention, a non-invasive method for detecting impending bearing faults in electric machines includes the steps of acquiring a plurality of stator current data sets from the electric machine during operation, applying each of the plurality of stator current data sets to a current data filter in real-time to generate a noise-cancelled stator current, and determining a fault index from the noise-cancelled stator current for each of the plurality of stator current data sets. The method also includes the steps of monitoring a value of the fault index for the plurality of stator current data sets and generating an alert if the value of a pre-determined number of fault indices exceeds a control limit.

In accordance with yet another aspect of the invention, a system for monitoring current to predict bearing faults includes at least one non-invasive current sensor configured to acquire stator current data from an operating motor and a processor connected to receive the stator current data from the at least one non-invasive current sensor. The processor is programmed to receive a first set of stator current data from the at least one current sensor, the first set of stator current data comprising baseline current data representative of normal motor operation. The processor is also programmed to define a non-fault component from the baseline current data, repeatedly receive real-time operating current data from the operating motor, and remove the non-fault component from the operating current data in real-time to isolate residual current data. The processor is further programmed to process the residual current data to identify possible bearing faults; generate a fault index for any identified bearing faults and generate an alert if the fault index exceeds a fault index threshold.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENT

The embodiments of the invention set forth herein relate to the detection of abnormal conditions to predictively determine potential motor faults. Current signature analysis (CSA) is utilized to review raw data received from a plurality of sensors of a controller monitoring an operating motor. The system, which is preferably disposed within the controller, decomposes the sensed/monitored current into a non-fault component and a fault component, and performs a noise-cancellation operation to isolate the fault component of the current and generate a fault identifier. An operator of the monitored motor system is then proactively alerted of a potential fault prior to a fault occurrence.

Figure 1:
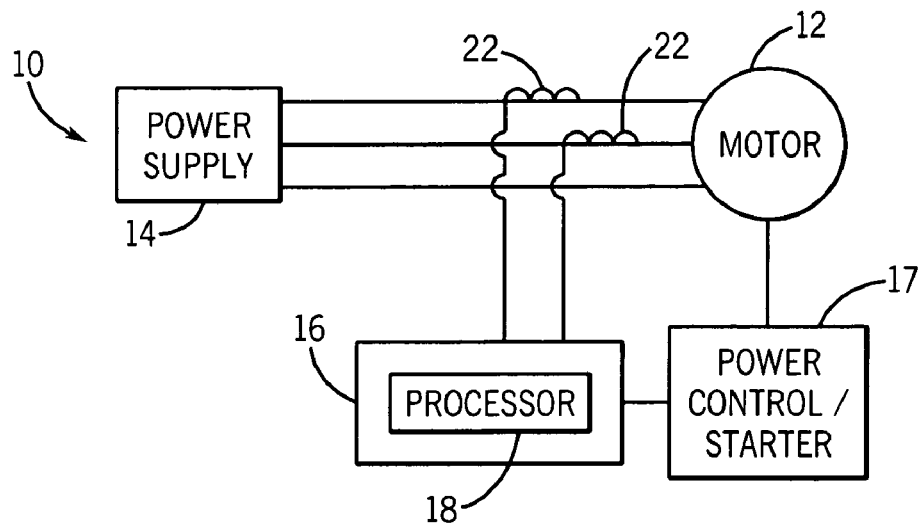
FIG. 1 is a schematic representation of a motor assembly contemplated for carrying out the invention.

Referring now to FIG. 1, a motor assembly, such as an induction motor, is configured to drive a load. The motor assembly 10 includes a motor 12 that receives power from a power supply 14. The motor assembly 10 also includes a controller 16 (i.e., current monitoring system) used to monitor, as well as control, operation of the motor 10 in response to operator inputs or motor fault conditions. The motor 12 and the controller 16 typically are coupled to electronic devices such as a power controller, or starter, 17 and are in series with the motor supply to control power to the motor 12. The controller 16 includes a processor 18 that, as will be described in greater detail with respect to FIG. 2, implements an algorithm to determine the presence of unwanted mechanical conditions and predictively alert an operator of a potential fault before a fault occurs. The controller 16 further includes current sensors 22. According to an exemplary embodiment of the invention, it is understood that current sensors 22 are existing sensors used to also monitor current input to the motor and generally monitor motor operation. That is, a separate set of current sensors for acquiring current data for use in the noise-cancellation system/technique of the invention (described in detail below) are not required. Thus, the acquisition of current data via current sensors 22 for use in the noise-cancellation system/technique is understood to form a "sensorless" current monitoring system/technique for predictively determining potential motor faults. As is generally known, current data may be acquired from only two of the phases of a three-phase motor as current data for the third phase may be extrapolated from the current data of the monitored two phases. While the present invention will be described with respect to a three-phase motor, the present invention is equivalently applicable to other motors. Additionally, while shown as including a pair of current sensors 22, it is also envisioned that a single current sensor could be used to acquire only one phase of current.

In one embodiment of the invention, current sensors 22 acquire stator current data from an induction motor. The stator current data acquired from sensors 22 is communicated to processor 18, where the current is analyzed using CSA to detect incipient (i.e., pending) motor faults, such as a bearing fault. As the identification of characteristic fault frequencies is not a viable solution for detection of all types of bearing faults (e.g., generalized roughness faults), according to an embodiment of the invention, processor 18 is programmed to treat the fault detection problem as a low signal-to-noise ratio (SNR) problem. Processor 18 is thus programmed to decompose the stator current into noise components and fault components (i.e., the bearing fault signal). The noise components are the dominant components in the stator current, and include supply fundamental frequencies and harmonics, eccentricity harmonics, slot harmonics, saturation harmonics, and other components from unknown sources, including environmental noises. Since these dominant components exist before and after the presence of a bearing fault, a large body of the information they contain is not related to the fault. In this sense, they can be treated as "noise" for the bearing fault detection problem. As the "noise" could be $10^4$ times stronger than the bearing fault signal (i.e., tens of Amperes vs. milli-Amperes), the detection of the bearing fault signal constitutes a low SNR problem. For solving the low SNR problem, processor 18 implements a noise cancellation technique/process for detecting the bearing fault signal. The noise components in the stator current are estimated and then cancelled by their estimates in a real-time fashion, thus providing a fault indicator from the remaining components.

While processor 18 is shown as being included in a stand-alone controller 16, it is also recognized that processor 18 could be included in power control/starter 17. Additionally, it is recognized that processor 18 could be included in another power control device such as a meter, relay, or drive. That is, it is understood that controller 16 could comprise an existing power control device, such as a meter, relay, starter, or motor drive, and that processor 18 could be integrated therein.

Figure 2:
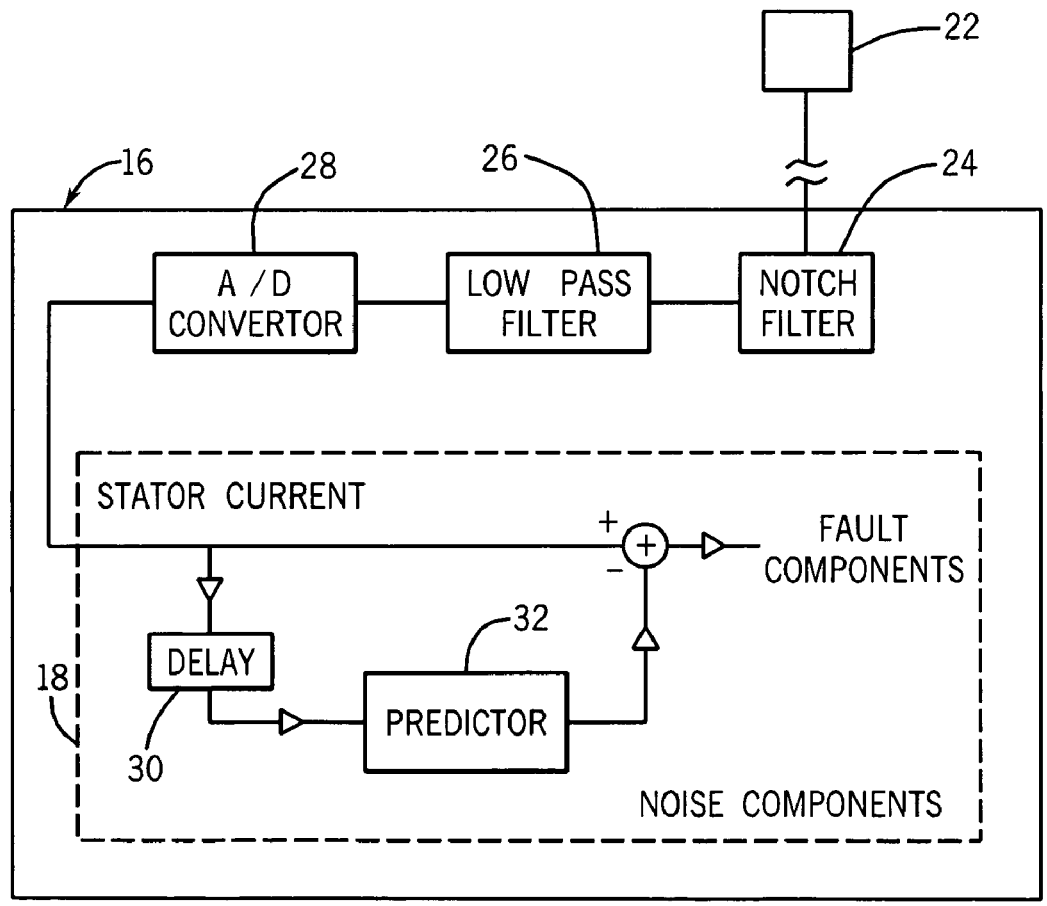
FIG. 2 is a block diagram of a controller in accordance with the invention.

Referring now to FIG. 2, a more detailed block diagram of controller 16 is shown. As stated with respect to FIG. 1, the controller 16 includes processor 18 and current sensors 22. Furthermore, the relay assembly 16 includes a notch filter 24, a low pass filter 26, and an analog to digital (A/D) convertor 28. The notch filter 24, low pass filter 26, and A/D convertor 28 operate to receive raw data generated by current sensors 22 and prepare the raw data for processing by processor 18. That is, filters 24 and 26 are used to eliminate the fundamental frequency (e.g. 60 Hz in US and 50 Hz in Asia) and low frequency harmonics, as these harmonic contents are not related to bearing failure. Removing such frequencies (especially the base frequency component) from the measured current data can greatly improve the analog-to-digital conversion resolution and SNR, as the 60 Hz frequency has a large magnitude in the frequency spectrum of the current signal. While controller 16 is shown as including filters 24, 26, it is also envisioned, however, that current data could be passed directly from current sensors 22 to the A/D convertor 28.

As shown in FIG. 2, processor 18 functions, at least in part, as a noise cancellation system that decomposes the stator current into noise components and fault components. Processor 18 thus includes an input delay 30 and a current predictor 32, with the current predictor 32 configured to predict noise components present in the stator current. Subtracting the prediction of the noise components from repeatedly acquired real-time stator current yields fault components which are injected into the stator current by bearing failures/faults. It is envisioned that current predictor 32 can be configured as a Wiener filter (infinite impulse response (IIR) or fixed impulse response (FIR)), a steepest descent algorithm, a least mean square (LMS) algorithm, a least recursive squares (LRS) algorithm, or other digital filter.

Figure 3:
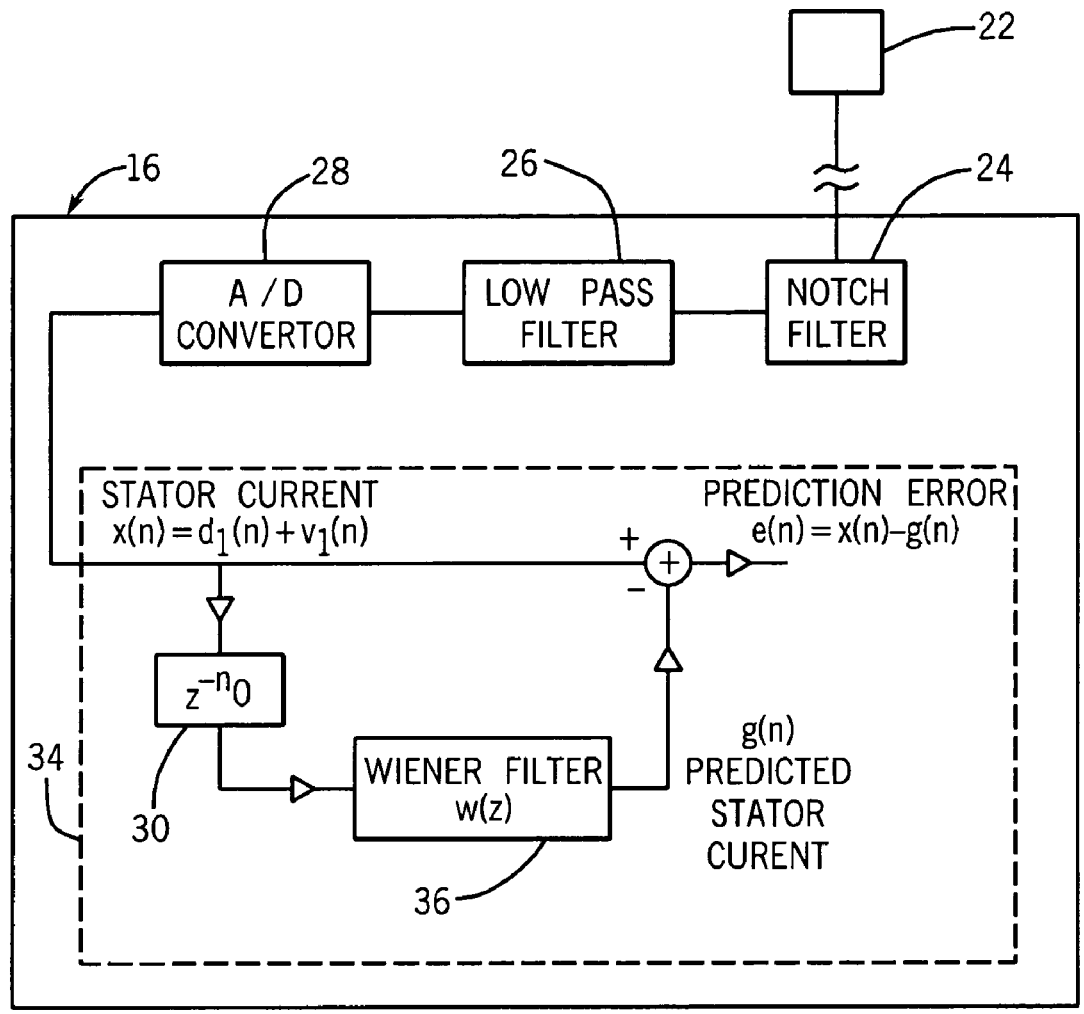
FIG. 3 is a block diagram of a controller for configuring of a Wiener filter in accordance with an embodiment of the invention.

Referring now to FIG. 3, in an exemplary embodiment of the invention, processor 34 includes therein a Wiener filter 36 that provides for noise cancellation in the stator current and isolation of a fault signal therein. To provide accurate noise cancellation in the stator current, processor 34 is programmed to configure Wiener filter 36 to accurately define (i.e., estimate) most noise components in the stator current, such that the fault signal in the stator current is not included in its output. In configuring the Wiener filter 36, processor 34 analyzes stator current data associated with healthy bearing conditions. This stator current data associated with healthy bearing conditions can include a first set of stator current data that is acquired, for example, within a short period after the installation of a bearing or at the start of a bearing condition monitoring process, thus ensuring that no bearing fault component is included in the stator current. The first set of stator current data thus comprises baseline current data that essentially contains pure noise data that does not include fault information.

The first set of stator current data, or baseline current data, is received by processor 34 and is implemented for configuring Wiener filter 36. More specifically, the baseline current data is used for assigning coefficients in the Wiener filter 36. Processor 34 assigns coefficients to the Wiener filter 36 such that the prediction error, e(n), of the filter is minimized in the mean-square sense. As shown in FIG. 3, the baseline current data is described by:

$$x(n) = d_1(n) + d(n) + v_1(n) \quad \text{[Eqn. 1]},$$

where $d_1(n)$ is the noise components, d(n) is the fault signal, and $v_1(n)$ is the measurement noise. As set forth above, the baseline current data is devoid of a fault signal, and as such, Eqn. 1 reduces to $x(n) = d_1(n) + v_1(n)$.

In configuring the Wiener filter 36, the processor 34 assigns the coefficients of the filter by using the minimum mean-squared error (MMSE) method. In implementing/applying the MMSE method, processor 34 solves for the coefficients, w(k), k=0, 1, . . . , p, to minimize the mean square prediction error, $\xi$, according to:

$$\xi = E\{|e(n)|^2\} = E\left\{\left|x(n) - \sum_{k=0}^{p} w(k)x(n - n_0 - k)\right|^2\right\}, \quad \text{[Eqn. 2]}$$

where E{ } is the expected value, $n_0$ is the delay of the input x(n), w(k), k=0, 1, . . . , p are the coefficients of the Wiener filter 36, and p is the order of the filter.

The coefficients are found by setting the partial derivatives of 4 with respect to w(k) equal to zero, as follows:

$$\frac{\partial \xi}{\partial w(k)} = E\frac{\partial e^2(n)}{\partial w(k)} = E\left\{2e(n)\frac{\partial e(n)}{w(k)}\right\} = 0; \quad \text{[Eqn. 3]}.$$
$$k = 0, 1, \dots, p.$$

Substituting:

$$\frac{\partial e(n)}{\partial w(k)} = -x(n - n_0 - k), \quad \text{[Eqn. 3a]}$$

into Eqn. 3 yields:

$$E\{e(n)x(n)x(n-n_0-k)\}=0; k=0, 1, \ldots, p \quad \text{[Eqn. 4]},$$

which is known as the orthogonality principle or the projection theorem. Substituting the equation:

$$e(n) = x(n) - \sum_{j=0}^{p} w(j)x(n - n_0 - j) \quad \text{[Eqn. 4a]}$$

into Eqn. 4 yields:

$$E\left\{\left[x(n) - \sum_{j=0}^{p} w(j)x(n - n_0 - j)\right]x(n - n_0 - k)\right\} = 0; \quad \text{[Eqn. 5]}$$
$$k = 0, 1, \dots, p,$$

or equivalently:

$$\sum_{j=0}^{p} w(j)E\left\{\begin{array}{l} x(n - n_0 - j) \\ x(n - n_0 - k) \end{array}\right\} = E\{x(n)x(n - n_0 - k)\}; \quad \text{[Eqn. 6]}$$
$$k = 0, 1, \dots, p.$$

By assuming that the signal x(n) is wide-sense stationary (WSS), then:

$$E\{x(n-j)x(n-k)\} = r_x(k-j) \quad \text{[Eqn. 7]}.$$

Eqn. 6 is thus simplified to:

$$\sum_{j=0}^{p} w(j)r_x(k-j) = r_x(n_0+k); k = 0, 1, \ldots, p. \quad \text{[Eqn. 8]}$$

In matrix form, Eqn. 8 can be written as:

$$\begin{bmatrix} r_x(0) & r_x(1) & \ldots & r_x(p) \\ r_x(1) & r_x(0) & \ldots & r_x(p-1) \\ \vdots & \vdots & & \vdots \\ r_x(p) & r_x(p-1) & \ldots & r_x(0) \end{bmatrix} \begin{bmatrix} w(0) \\ w(1) \\ \vdots \\ w(p) \end{bmatrix} = \begin{bmatrix} r_x(n_0) \\ r_x(n_0+1) \\ \vdots \\ r_x(n_0+p) \end{bmatrix}, \quad \text{[Eqn. 9]}$$

or denoted by:

$$R_x w = r. \quad \text{[Eqn. 10]}$$

The autocorrelation sequences in Eqn. 9 can be estimated by time averages when implementing this method. For finite data records (i.e., a finite number of stator current data points), $x(n)$, $0 \leq n \leq N-1$, the autocorrelation sequences can be estimated by:

$$\hat{r}_x(k) = \frac{1}{N} \sum_{n=0}^{N-1} x(n)x(n-k). \quad \text{[Eqn. 11]}$$

The matrix $R_x$ is a symmetric Toeplitz matrix and can be solved efficiently by the Levinson-Durbin Recursion algorithm.

As shown in FIG. 3, the output of Wiener filter 36 is a prediction, $g(n)$, of the stator current, with the prediction error, $e(n)$, of the filter being defined as the measured baseline current data, $x(n)$, minus the predicted stator current $g(n)$. As set forth above, the coefficients of the Wiener filter 36 are assigned such that the prediction error $e(n)$ is minimized in the mean square sense (i.e., $e(n) \approx 0$). Thus, as the baseline current data is composed of essentially just a noise component, $d_1(n)+v_1(n)$, the predicted stator current $g(n)$ should also be comprised of essentially just a noise component, forming a predicted noise component, $d_1\hat{}(n)+v_1\hat{}(n)$, that can be used in continued real-time monitoring of the bearing condition for noise cancellation in repeatedly acquired stator current data and for identification of bearing fault signals.

Figure 4:
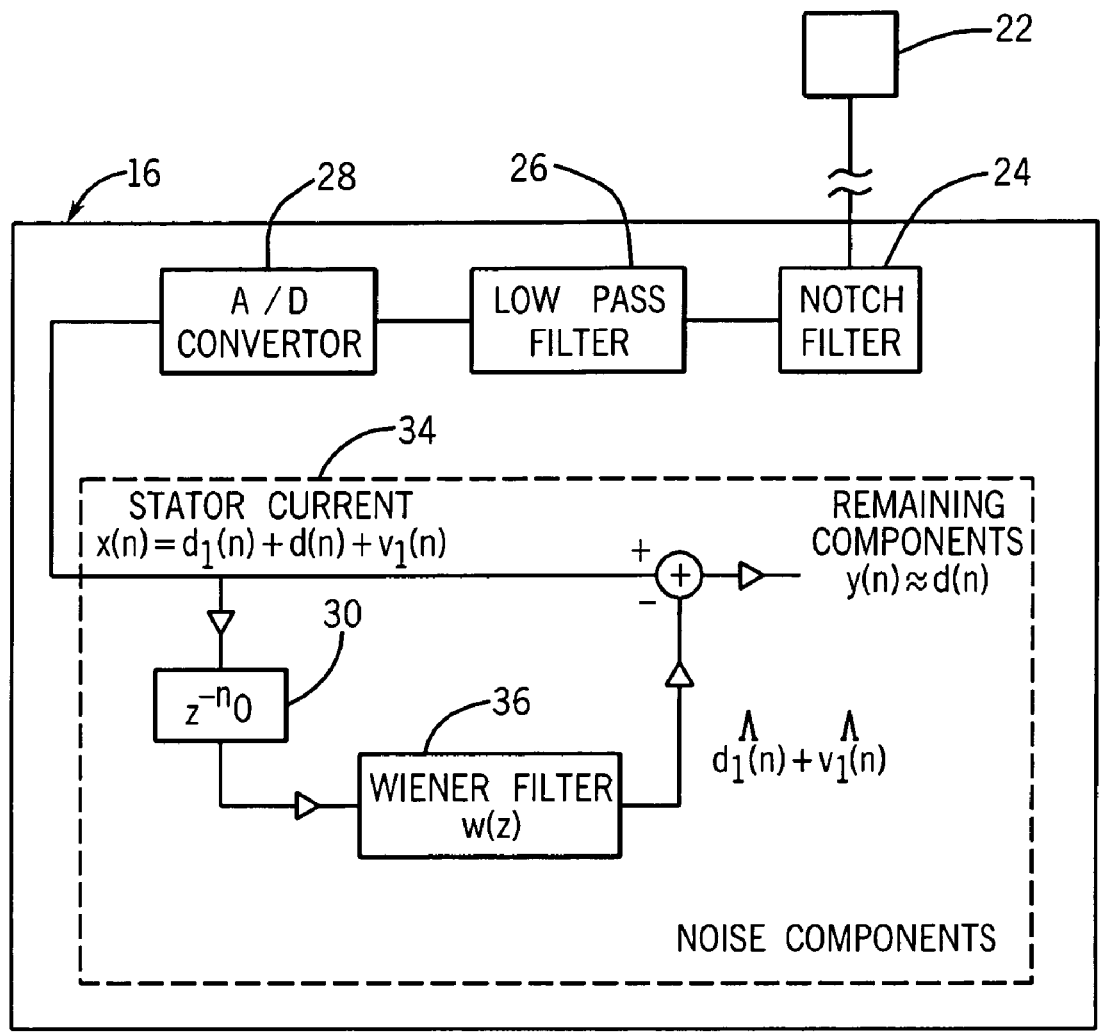
FIG. 4 is a block diagram of a controller for performing fault detection using current noise cancellation in accordance with an embodiment of the invention.

As set forth above, upon configuring of Wiener filter 36 (i.e., setting of the Wiener filter coefficients) from the previous samples of the stator current (i.e., the baseline current data), processor 34 is able to accurately detect bearing fault conditions in the motor system by estimating the noise components in additionally acquired stator current in real-time. As the dominant noise components (sinusoidal) in the stator current essentially do not change at constant loads, either in magnitude or in frequency, they can therefore be predicted in the most recent samples (i.e., real-time samples) of the stator current that is being monitored. Thus, in monitoring operation of the induction motor 12 (FIG. 1), additional sets of stator current data are acquired by sensors 22 and received by processor 34 for performing a stator current noise cancellation thereon. The additional sets of stator current data, are defined by:

$$x(n) = d_1(n)+d(n)+v_1(n), \quad \text{[Eqn. 11a]},$$

where $d_1(n)$ is the noise components, $d(n)$ is the fault signal, and $v_1(n)$ is the measurement noise, as set forth above in Eqn. 1. As shown in FIG. 4, in monitoring current data from the inductor motor, the stator current is passed through input delay 30, which provides a delay z of $n_0$ samples and through Wiener filter 36, to cancel the estimated noise components $d_1\hat{}(n)+v_1\hat{}(n)$ therefrom and produce a noise-cancelled stator current. From FIG. 4, it can be seen that if the Wiener filter 36 has a good performance (i.e., $d_1\hat{}(n)+v_1\hat{}(n)$ is close to $d_1(n)+v_1(n)$), the remaining part, $y(n)$, of the stator current after noise cancellation (i.e., residual current data) will be the fault signal $d(n)$. That is, when a bearing fault develops, the Wiener filter 36 predicts and cancels only the noise components in the stator current and keeps any remaining residual current data intact during the noise canceling process, from which fault components $d(n)$ are identified. It is noted that the fault components $d(n)$ are comprised of a plurality of fault characteristics from across a fault frequency spectrum. That is, a plurality of fault frequencies having a plurality of fault amplitudes comprise the fault components, and a collective effect of these frequencies and amplitudes are encompassed by the isolated fault components to facilitate the fault detection. As the frequencies of the fault signal and the magnitudes of the fault components are small for generalized roughness bearing faults, the summation of these factors in the collective fault component $d(n)$ allows for increased fault signal strength and improved bearing fault detection.

From the isolated fault components remaining in the noise-cancelled stator current, a fault index (i.e., fault indicator) is determined by processor 34. In an exemplary embodiment, the fault index is calculated as the root mean square (RMS) value of the noise-cancelled stator current. Taking the RMS value of the isolated fault components provides for a larger fault signal that can be monitored, allowing for improved recognition of bearing faults. Processor 34 is further programmed to analyze the fault index to determine if the fault index exceeds a threshold. If the fault index exceeds the threshold, then processor 34 generates an alert (i.e., audible or visual alert) to inform an operator that a fault component in the stator current has exceeded a desired amount. The operator can thus shut down operation of the motor at a convenient time to further assess the bearings. Alternatively, or in addition thereto, the fault information and its severity can also be communicated to a centralized monitoring system (not shown), such as a Computerized Maintenance Management System (CMMS) or distributed control system (DCS).

In an exemplary embodiment of the invention, a Statistical Process Control (SPC) technique is applied to analyze a plurality of fault indices and set a "threshold" based thereon. With respect to analyzing the fault components present in the stator current to detect generalized roughness bearing faults, it is difficult to relate these fault components in the stator current to the bearing fault severity. That is, the lack of equations available to describe fault signatures in stator current injected by generalized roughness bearing faults and the subtleness of bearing fault signatures in stator current makes it difficult to pre-define fault severity levels. As such, a SPC technique is applied to establish a warning threshold based on the statistics of the fault signal in the specific current monitoring process, rather than pre-setting a pre-defined, universal threshold for all applications. The SPC technique distinguishes abnormal changes in the noise-cancelled stator current (and resulting fault indices) that are caused by a bearing fault from ambient changes.

Figure 5:
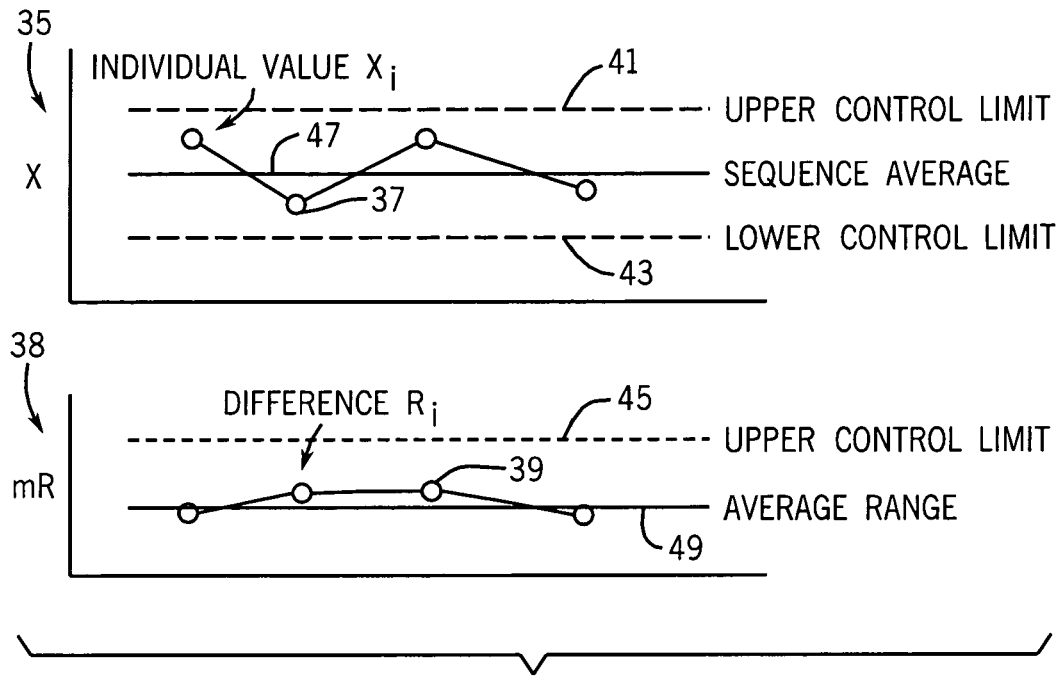
FIG. 5 is a graphical representation of plotted fault index data relative to fault index thresholds according to a statistical process control technique in accordance with an embodiment of the invention.

Referring to FIG. 5, application of the SPC technique to the generated fault indices obtained via stator current noise cancellation is shown. Each fault index is plotted to an X chart 35, displaying individual fault index values 37, and a mR (i.e., "moving Range") chart 38 for monitoring differences 39 between the values of the fault indices. The individual measurements 37 are plotted on the X chart 35 and the differences 39 (i.e., moving range) are plotted on the mR chart 38. Based on the plotted values, upper and lower control limits 41, 43 are determined from the X chart 35 and an upper control limit 45 is determined for the mR chart 38. For bearing fault detection, since the SPC is applied to noise-cancelled stator current, a fault index value falling below a lower control limit indicates a better bearing condition and, therefore, it is not of concern. As such, the upper control limit 41 of the X chart 35 and/or the upper control limit 45 of the mR chart 38 comprise the relevant control limit (i.e., fault index warning threshold) for determining a threshold exceedance. In one embodiment, the upper control limits 41, 45 can be set at three standard deviations from the mean fault index value 47 and at three standard deviations from the mean difference value between adjacently acquired fault indices 49, respectively.

Upon calculation of the control limits 41, 45 via the SPC technique, the fault indices are analyzed with respect to these control limits. Detection of an uncontrolled variation in the fault indices is indicative of a deteriorated bearing condition. That is, if the analyzed fault indices begin to frequently exceed the control limits 41, 45, such a variation is indicative of a deteriorated bearing condition (i.e., incipient bearing fault). Thus, in determining whether a deteriorated bearing condition exists that necessitates generation of an alert, the percentage of fault indices exceeding the upper control limit 41, 45 is examined. If that percentage exceeds a pre-determined percentage, then it is determined that a deteriorated bearing condition exists and an alert is generated. For example, if the percentage of fault indices falling outside (i.e., exceeding) the control limits 41, 45 is above 10%, then an alert is generated. A SPC technique is thus utilized to monitor the fault indices obtained in real-time and analyze the fault index values to determine if a "threshold" has been exceeded, thus allowing for a determination that a deteriorated bearing condition or bearing fault exists.

Figure 6:
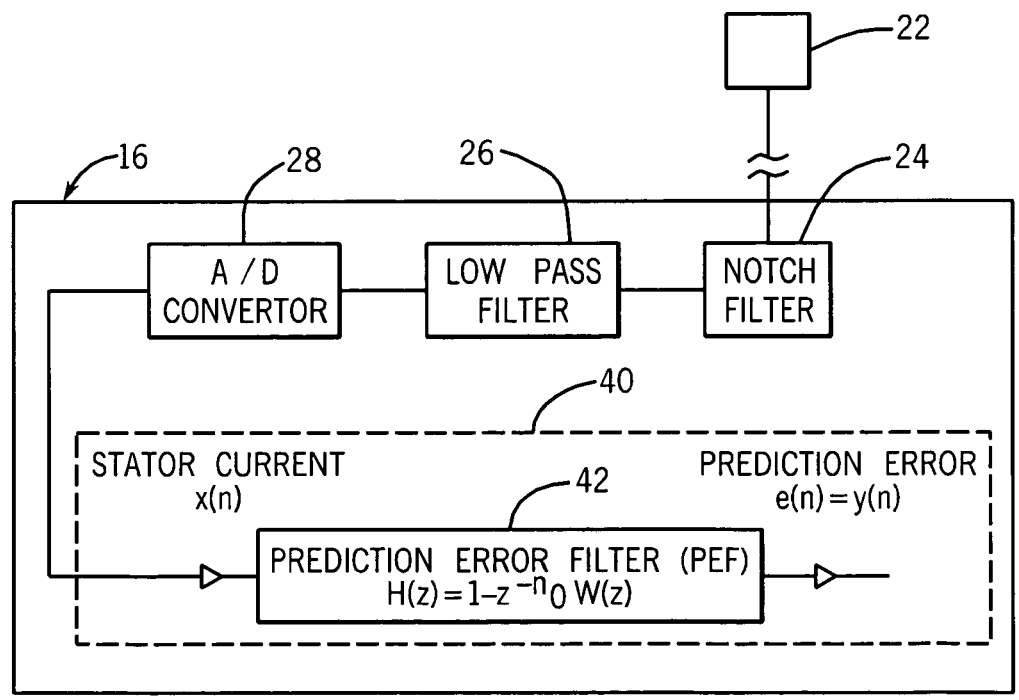
FIG. 6 is a block diagram of a controller in accordance with another embodiment of the invention.

Referring now to FIG. 6, in another embodiment of the invention, the fault information $d(n)$ in the stator current isolated by the noise cancellation technique of processor 40 can be viewed as the prediction error $e(n)$ of a prediction error filter (PEF) 42. That is, when the bearing fault develops and the condition of the system changes, the prediction error increases. As shown in FIG. 6, if the noise cancellation system/technique is viewed as a PEF 42, then the system performance can be measured by the prediction error of the filter. That is, to have good performance, the prediction error should be significantly larger for a faulted bearing condition than for a healthy bearing condition. Consequently, the prediction error shown in FIG. 6 gets larger when the system enters a bearing fault condition from a healthy bearing condition.

In examining the PEF 42 to assess a prediction error, a general equation describing the prediction error can be given, along with specific equations for the filter performance for a healthy-bearing condition and for the filter performance having a bearing-fault condition. By definition, a general equation for the mean-square prediction error of the filter is:

$$\xi = E\left\{\left|x(n) - \sum_{k=0}^{p} w(k)x(n - n_0 - k)\right|^2\right\}. \quad \text{[Eqn. 12]}$$

This is the same error as in Eqn. 2, which was minimized to find the coefficients of the Wiener filter. Upon expansion, the above equation can be rewritten as:

$$\xi = \left[r_x(0) - \sum_{k=0}^{p} w(k)r_x(n_0 + k)\right] + \sum_{k=0}^{p} w(k)\left[\sum_{j=0}^{p} w(j)r_x(k - j) - r_x(n_0 + k)\right]. \quad \text{[Eqn. 13]}$$

Since the PEF 42 is designed to minimize the error in Eqn. 12 by using healthy bearing data, this prediction error is small for a healthy-bearing condition. In fact, for a healthy-bearing condition, since $w(k)$, $k=0, 1, \ldots, p$, are solutions to Eqn. 8, the second term of the right hand side of Eqn. 13 is zero. Therefore, the prediction error for a healthy-bearing condition is:

$$\xi_{min} = r_x(0) - \sum_{k=0}^{p} w(k)r_x(n_0 + k). \quad \text{[Eqn. 14]}$$

At such a condition, since $x(n) = d_1(n) + v_1(n)$, therefore, it follows that:

$$r_x(k) = E\{x(n)x(n+k)\} \quad \text{[Eqn. 15]}$$
$$= E\{[d_1(n) + v_1(n)][d_1(n+k) + v_1(n+k)]\}$$
$$= E\{d_1(n)d_1(n+k)\} + E\{d_1(n)v_1(n+k)\} +$$
$$E\{v_1(n)d_1(n+k)\} + E\{v_1(n)v_1(n+k)\}.$$

Since $d_1(n)$ and $v_1(n)$ are jointly wide sense stationary (WSS), Eqn. 15 becomes:

$$r_x(k) = r_{d_1}(k) + 2r_{d_1 v_1}(k) + r_{v_1}(k) \quad \text{[Eqn. 16]}.$$

Since the measurement noise $v_1(n)$ is random, its power spectrum is distributed over a broad frequency range, its autocorrelation is pulse-like, and its cross-correlations with other signals are zero. (i.e., the autocorrelation sequences of a signal are the inverse Fourier transform of its power spectrum by definition). It thus follows from Eqn. 16 that:

$$r_x(0) = r_{d_1}(0) + r_{v_1}(0), \, r_x(k) = r_{d_1}(k), \, k \neq 0. \quad \text{[Eqn. 17]}.$$

Substituting Eqn. 17 into Eqn. 14 yields:

$$\xi_{min} = r_{d_1}(0) + r_{v_1}(0) - \sum_{k=0}^{p} w(k)r_{d_1}(n_0 + k). \quad \text{[Eqn. 18]}$$

To further investigate the performance of the system, the noise components (including the supply fundamental and harmonics, the eccentricity harmonics, the slot harmonics, etc.) are described as:

$$d_1(n) = \sum_{m=1}^{M} A_m \sin(\omega_m n + \varphi_m), \quad \text{[Eqn. 19]},$$

where $A_m$, $\omega_m$, $\phi_m$, m=1, ..., M, are the amplitudes, the frequencies, and the angles of M noise components in the stator current. To compute the autocorrelation sequences of the signal $d_1(n)$, the following relationship is defined:

$$r_{d_1}(k) = E\{d_1(n)d_1(n+k)\} = E\left\{\left[\sum_{m=1}^{M} A_m \sin(\omega_m n + \varphi_m)\right]\left[\sum_{j=1}^{M} A_j \sin[\omega_j(n+k) + \varphi_j]\right]\right\} = \quad [\text{Eqn. 20}]$$

$$E\left\{\sum_{m=1}^{M} A_m^2 \sin(\omega_m n + \varphi_m) \sin[\omega_m(n+k) + \varphi_m]\right\} +$$

$$E\left\{\sum_{m=1}^{M} A_m \sum_{j=1,j\neq m}^{M} A_j \sin(\omega_m n + \varphi_m) \sin[\omega_j(n+k) + \varphi_j]\right\}.$$

Eqn. 20 is then reduced by recognizing the following relationships:

$$E\left\{\sum_{m=1}^{M} A_m^2 \sin(\omega_m n + \varphi_m) \sin[\omega_m(n+k) + \varphi_m]\right\} = \quad [\text{Eqn. 21}]$$

$$\sum_{m=1}^{M} \frac{A_m^2}{2} E\left\{\cos(\omega_m k) - \cos\left(\begin{array}{c}2\omega_m n + \\ \omega_m k + 2\varphi_k\end{array}\right)\right\} = \sum_{m=1}^{M} \frac{A_m^2}{2}\cos(\omega_m k)$$

and $$E\left\{\sum_{m=1}^{M} A_m \sum_{j=1,j\neq m}^{M} A_j \sin(\omega_m n + \varphi_m) \sin[\omega_j(n+k) + \varphi_j]\right\} = \quad [\text{Eqn. 22}]$$

$$\frac{1}{2}\sum_{m=1}^{M} A_m \sum_{j=1,j\neq m}^{M} A_j \left\{E\left\{\cos\left[\begin{array}{c}(\omega_j - \omega_m)n + \\ \omega_j k + (\varphi_j - \varphi_m)\end{array}\right]\right\} - E\left\{\cos\left[\begin{array}{c}(\omega_j + \omega_m)n + \\ \omega_j k + (\varphi_j + \varphi_m)\end{array}\right]\right\}\right\} = 0$$

Therefore, the autocorrelation sequences of the signal $d_1(n)$ are:

$$r_{d_1}(k) = \sum_{m=1}^{M} \frac{A_m^2}{2}\cos(\omega_m k). \quad [\text{Eqn. 23}]$$

Substituting Eqn. 23 into Eqn. 18 yields the prediction error of the filter 42 for a healthy-bearing condition as:

$$\xi_{min} = \sum_{m=1}^{M} \frac{A_m^2}{2}\left\{1 - \sum_{k=0}^{p} w(k)\cos[\omega_m(n_0+k)]\right\} + r_{v_1}(0). \quad [\text{Eqn. 24}]$$

Similarly, for a faulty bearing condition, the mean square prediction error can still be calculated from Eqn. 13. For convenience, Eqn. 13 is repeated here as:

$$\xi = \left[r_x(0) - \sum_{k=0}^{p} w(k) r_x(n_0+k)\right] + \sum_{k=0}^{p} w(k)\left[\sum_{j=0}^{p} w(j) r_x(k-j) - r_x(n_0+k)\right]. \quad [\text{Eqn. 25}]$$

However, different from the situation of a healthy-bearing condition, the second term on the right hand side of Eqn. 25 for a faulty-bearing condition is not zero because of the presence of the fault signal in the stator current, which is $x(n)=d_1(n)+d(n)+v_1(n)$. It follows that:

$$r_x(k) = E\{x(n)x(n+k)\} = E\{[d_1(n)+d(n)+v_1(n)][d_1(n+k)+d(n+k)+v_1(n+k)]\} \quad [\text{Eqn. 26}].$$

Assuming $d_1(n)$, $d(n)$, and $v_1(n)$ are jointly WSS, then Eqn. 26 becomes:

$$r_x(k) = r_{d_1}(k) + r_d(k) + r_{v_1}(k) + 2r_{d_1v_1}(k) + 2r_{d_1d}(k) + 2r_{dv_1}(k) \quad [\text{Eqn. 27}].$$

As for a healthy-bearing condition, if it is assumed that the measurement noise $v_1(n)$ is a broadband signal and not correlated with $d_1(n)$ and $d(n)$, it then follows that:

$$r_x(0) = r_{d_1}(0) + r_d(0) + r_{v_1}(0) + 2r_{d_1d}(0) \quad [\text{Eqn. 28}],$$

and that:

$$r_x(k) = r_{d_1}(k) + k + r_d(k) + 2r_{d_1d}(k), \; k \neq 0 \quad [\text{Eqn. 29}].$$

If the noise components are described as:

$$d_1(n) = \sum_{m=1}^{M} A_m \sin(\omega_m n + \varphi_m), \quad [\text{Eqn. 29a}]$$

as set forth in Eqn. 19, then the fault components can be described as:

$$d(n) = \sum_{q=1}^{Q} B_q \sin(\omega_q n + \varphi_q), \quad [\text{Eqn. 30}]$$

where $A_q$, $\omega_q$, $\phi_q$, q=1, ... Q, are the amplitudes, the frequencies, and the angles of Q fault components in the stator current injected by a bearing fault. The autocorrelation sequences of $d(n)$ can thus be calculated as in Eqns. 20 to 23, with the result being:

$$r_d(k) = \sum_{q=1}^{Q} \frac{B_q^2}{2}\cos(\omega_q k). \quad [\text{Eqn. 31}]$$

For $\omega_q \neq \omega_m$, q=1, 2, ..., Q, m=1, 2, ..., M, following the same steps as in Eqns. 20 to 23, the cross-correlation sequences between the noise components and the fault components become:

$$r_{d_1d}(k) = 0, \; k: \text{integer} \quad [\text{Eqn. 32}].$$

Thus, combining Eqns. 25 to 32, the prediction error for a faulty-bearing condition can be obtained as:

$$\xi = \xi_{min} + \sum_{q=1}^{Q} \frac{B_q^2}{2} \left\{ 1 - \sum_{k=0}^{P} w(k)\cos[\omega_q(n_0 + k)] \right\} + \sum_{q=1}^{Q} \frac{B_q^2}{2} \left\{ \sum_{k=0}^{P} w(k) \left[ \begin{array}{c} \sum_{j=0}^{P} w(j)\cos(\omega_q(k-j)) - \\ \cos(\omega_q(n_0 + k)) \end{array} \right] \right\},$$ [Eqn. 33]

where $\xi_{min}$ is the prediction error for a healthy-bearing condition expressed in Eqn. 24.

Beneficially, it is noted that the noise cancellation method set forth above considers a collective effect of the fault components to facilitate the fault detection. That is, as the frequencies of the fault signal, $\omega_q$'s, and the magnitudes of the fault components, $B_q$'s, are small for generalized roughness bearing faults, summing these factors in the collective fault component d(n), along with the bearing contact angle $\phi_q$, allows for increased fault signal strength and improved bearing fault detection. It is further noted that if the fault signal, d(n), is a broadband signal, then it has the same effect as the broadband measurement noise $v_1(n)$, and since the power of the broadband signal remains in the prediction error (both for a healthy-bearing condition and for a faulty-bearing condition), the presence of the fault signal results in an increase of the prediction error.

Additionally, even if $\omega_q = \omega_m$ and there is a smaller increase in the prediction error, (since the third term on the right hand side of Eqn. 33 is zero, while the second term is nonzero), fault information is still conserved in the resulting predictor error. That is, even if the fault components and the noise components have common frequencies, such as when the bearing fault augments the dynamic eccentricity of the motor, the fault information is still conserved in the resulting predictor error. The above features thus provide for an improved current-based sensing technique to detect generalized roughness bearing faults.

Figure 7:
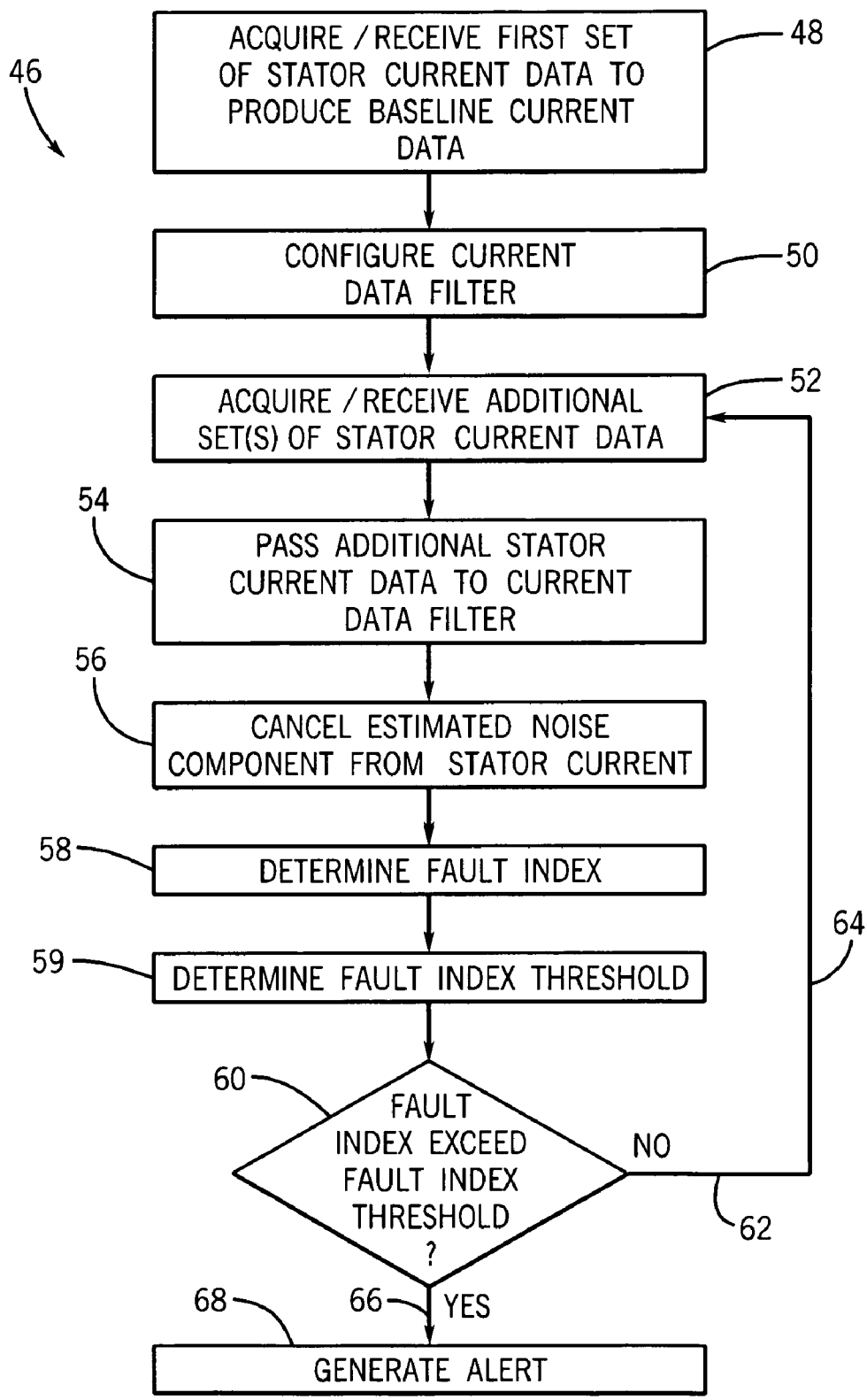
FIG. 7 is a flow chart illustrating a technique for fault detection using current noise cancellation.

Referring now to FIG. 7, a flow chart illustrating a current-based technique 46 for detecting generalized roughness bearing faults is displayed. The technique begins by acquiring and receiving a first set of stator current data, x(n), from an electrical machine, such as a three-phase induction motor, to produce baseline current data 48. The first set of stator current data that is acquired/received is comprised of stator current data associated with healthy bearing conditions, which is known to be devoid of any bearing fault signal therein.

From the baseline current data, a current data filter (i.e., noise cancellation system) is configured 50 to provide noise cancellation to the stator current, so as to isolate any fault component present therein. In an exemplary embodiment, the current data filter is a Wiener filter that is designed to cancel the noise component from the stator current based on a filtering of received stator current data by an estimation of the noise component in the stator current. To provide accurate noise cancellation in the stator current, the Wiener filter is configured such that it can accurately estimate most noise components in the stator current and such that the fault signal in the stator current is not included in its output. In configuring the Wiener filter, the baseline current data is used for assigning coefficients in the Wiener filter, such that no bearing fault information is embedded in the coefficients. The Wiener filter is designed such that a prediction error thereof is minimized in the mean square sense. That is, the coefficients are assigned using the MMSE method. As the Wiener filter is configured based on the baseline current data (i.e., pure noise current data), this means that the output of the Wiener filter is a predicted noise component, g(n), of the stator current that is essentially equal to the baseline current data, such that the prediction error is minimized, i.e., e(n)=x(n)-g(n).

After configuring of the Wiener filter, the technique continues by acquiring and receiving at least one additional set of stator current data 52. The additional stator current data is acquired/received after a period of use of the electrical machine and is monitored to detect bearing fault signals present in the stator current. The additional sets of stator current data are passed to the current data filter 54 to perform a noise component cancellation thereon. The estimated noise component provided by the current data filter is cancelled from the stator current 56 to isolate any fault component present in the stator current. That is, as the noise components (sinusoidal) in the stator current essentially do not change at constant loads, either in magnitude or in frequency, the predicted noise component output from the current data filter (and based on the baseline current data) can be cancelled from the most recent samples of the stator current (i.e., the additionally acquired stator current) to accurately determine a fault component in the stator current. Assuming that the current data filter was properly configured and has good performance, the remaining part of the stator current after noise cancellation will accurately portray the fault signal d(n).

From the fault component remaining in the noise-cancelled stator current, a fault index (i.e., fault indicator) is determined 58. In an exemplary embodiment, the fault indicator is calculated as the RMS value of the noise-cancelled stator current. Taking the RMS value of the isolated fault component provides for a larger signal that can be monitored, allowing for improved recognition of bearing faults. Upon calculation, the fault index is compared to additionally calculated fault indices to generate a fault index threshold 59 and determine if the fault indicator exceeds that fault index threshold 60. If the fault indicator does not exceed the fault index threshold 62, then the technique proceeds by continuing to receive and monitor additional stator current data 64. If, however, the fault indicator does exceed the fault index threshold 66, then an alert is generated 68, such as an audible or visual alert, to inform an operator that a fault component in the stator current has exceeded a desired amount. The operator is thus allowed to shut down operation of the electrical machine to further examine the bearings for faults.

In an exemplary embodiment of the technique 46, the fault index threshold is determined 59 via a SPC technique. The fault index threshold (i.e., control limit) is determined for each of an X chart and a mR chart. Upon calculation of the fault index thresholds via the SPC technique, the fault indices are analyzed with respect to these thresholds 60. If a predetermined amount or percentage of the fault indices fall outside the fault index thresholds 66, it is determined that a deteriorated bearing condition exists and an alert is generated 68. For example, if the percentage of fault indices falling outside the control limits is above 10%, then an alert can be generated. A SPC technique is thus utilized to monitor the fault indices obtained in real-time and analyze the fault index values to determine if a "threshold" has been exceeded, thus allowing for a determination that a deteriorated bearing condition or bearing fault exists.

According to embodiments of the invention, the noise cancellation method set forth above is able to isolate fault components in the stator current to detect incipient bearing faults without the need for determining machine parameters, bearing dimensions, nameplate values, or stator current spectrum distributions. The analysis of the noise-cancelled stator current (and the fault indices generated therefrom) via the use of a SPC technique eliminates the need for knowledge of such machine parameters, bearing dimensions, nameplate values, or stator current spectrum distributions. That is, as the noise cancellation method determines control limits and fault index warning thresholds by way of a SPC technique based on acquired fault index values rather than on a set of pre-defined equations describing fault signatures in the stator current, such information is not needed for analysis of fault components in the stator current. As the determination/acquisition of machine parameters, bearing dimensions, nameplate values, or stator current spectrum distributions can be difficult and time consuming, the lack of a need for such information in embodiments of the system and method of the invention results in more efficient current-based bearing fault detection.

A technical contribution for the disclosed method and apparatus is that it provides for a computer implemented technique for detecting impending mechanical motor faults by way of current noise cancellation. Current data is decomposed into a non-fault component (i.e., noise) and a fault component, and noise-cancellation is performed to isolate the fault component of the current and generate a fault index.

Therefore, according to one embodiment of the present invention, a controller configured to detect indicia of incipient mechanical motor faults includes a processor programmed to receive a set of current data from a motor during known normal operation, define a baseline noise based on the set of current data acquired from the know normal operating motor, and repeatedly receive real-time operating current data from the operating motor. The processor is further programmed to remove the baseline noise from the operating current data to identify any fault components present in the operating current data and generate a fault index for the operating current data based on any isolated fault components.

According to another embodiment of present invention, a non-invasive method for detecting impending bearing faults in electric machines includes the steps of acquiring a plurality of stator current data sets from the electric machine during operation, applying each of the plurality of stator current data sets to a current data filter in real-time to generate a noise-cancelled stator current, and determining a fault index from the noise-cancelled stator current for each of the plurality of stator current data sets. The method also includes the steps of monitoring a value of the fault index for the plurality of stator current data sets and generating an alert if the value of a pre-determined number of fault indices exceeds a control limit.

According to yet another embodiment of the present invention, a system for monitoring current to predict bearing faults includes at least one non-invasive current sensor configured to acquire stator current data from an operating motor and a processor connected to receive the stator current data from the at least one non-invasive current sensor. The processor is programmed to receive a first set of stator current data from the at least one current sensor, the first set of stator current data comprising baseline current data representative of normal motor operation. The processor is also programmed to define a non-fault component from the baseline current data, repeatedly receive real-time operating current data from the operating motor, and remove the non-fault component from the operating current data in real-time to isolate residual current data. The processor is further programmed to process the residual current data to identify possible bearing faults; generate a fault index for any identified bearing faults and generate an alert if the fault index exceeds a fault index threshold.

The present invention has been described in terms of the preferred embodiment, and it is recognized that equivalents, alternatives, and modifications, aside from those expressly stated, are possible and within the scope of the appending claims.

What is claimed is:

1. A controller configured to detect indicia of incipient mechanical motor faults having a processor programmed to:
   receive a set of current data from a motor during known normal operation;
   define a baseline noise based on the set of current data acquired from the known normal operating motor;
   repeatedly receive real-time operating current data from the operating motor;
   remove the baseline noise from the operating current data to identify any fault components present in the operating current data; and
   generate a fault index for the operating current data based on any isolated fault components.

2. The controller of claim 1 wherein the processor is further programmed to apply a statistical process control analysis to a plurality of generated fault indices to calculate a fault index warning threshold.

3. The controller of claim 2 wherein the processor is further programmed to generate an alert if a detected variation of the fault index exceeds the fault index warning threshold.

4. The controller of claim 3 wherein the processor is further programmed to:
   determine a percentage of fault indices that exceed the fault index warning threshold; and
   generate the alert if the percentage of fault indices that exceed the fault index warning threshold exceed a pre-determined percentage.

5. The controller of claim 1 wherein the processor is further programmed to configure a Wiener filter based on the set of current data acquired from the known normal operating motor, the Wiener filter configured to estimate the baseline noise.

6. The controller of claim 5 wherein the processor is further programmed to perform a minimum mean-squared error (MMSE) operation on the Wiener filter to minimize error in the estimated baseline noise.

7. The controller of claim 5 wherein the fault components comprise a prediction error of the Wiener filter.

8. The controller of claim 1 wherein the processor is further programmed to calculate a root-mean-square (RMS) value of the fault components to generate the fault index.

9. The controller of claim 1 further comprising:
   a current sensor;
   a notch filter connected to receive current data from the current sensor;
   a low-pass filter connected to receive the current data from the notch filter;
   an analog-to-digital converter connected to receive the current data from the low-pass filter; and
   a delay unit connected to receive the current data from the analog-to-digital converter to ensure data capture during real-time monitoring.

10. The controller of claim 1 controller configured to detect at least one of a generalized roughness bearing fault and a single point defect bearing fault based on the fault index.

11. The controller of claim 1 wherein the fault components comprise a plurality of fault frequencies having a plurality of fault amplitudes, and wherein the fault index comprises a summation of the fault amplitudes of the plurality of fault frequencies.

12. A non-invasive method for detecting impending bearing faults in electric machines comprising:
   acquiring a plurality of stator current data sets from the electric machine during operation;
   applying each of the plurality of stator current data sets to a current data filter in real-time to generate a noise-cancelled stator current;
   determining a fault index from the noise-cancelled stator current for each of the plurality of stator current data sets;
   monitoring a value of the fault index for the plurality of stator current data sets; and
   generating an alert if the value of a pre-determined number of fault indices exceeds a control limit.

13. The method of claim 12 further comprising:
   applying a statistical process control (SPC) technique to the fault indices; and
   setting the control limit based on the SPC technique.

14. The method of claim 13 further comprising:
   determining a percentage of the fault indices that exceed the control limit; and
   generating the alert if the percentage of the fault indices that exceed the control limit is above the pre-determined number.

15. The method of claim 12 wherein applying the stator current data to a current data filter comprises applying the stator current data to a Wiener filter.

16. The method of claim 15 further comprising:
   acquiring baseline stator current data prior to acquisition of the plurality of stator current data sets, the baseline stator current data acquired from the electric machine at a normal operating condition; and
   applying the baseline stator current data to the Wiener filter to estimate noise components therein.

17. The method of claim 16 wherein generating a noise-cancelled stator current for each of the plurality of stator current data sets comprises cancelling the estimated noise components from the acquired stator current data set.

18. The method of claim 16 further comprising selecting coefficients in the Wiener filter by applying a minimum mean-squared error (MMSE) operation to the baseline stator current data.

19. The method of claim 12 wherein determining a fault index comprises calculating a root-mean square of the noise-cancelled stator current.

20. A system for monitoring current to predict bearing faults comprising:
   at least one non-invasive current sensor configured to acquire stator current data from an operating motor; and
   a processor connected to receive the stator current data from the at least one non-invasive current sensor, the processor programmed to:
     receive a first set of stator current data from the at least one current sensor, the first set of stator current data comprising baseline current data representative of normal motor operation;
     define a non-fault component from the baseline current data;
     repeatedly receive real-time operating current data from the operating motor;
     remove the non-fault component from the operating current data in real-time to isolate residual current data;
     process the residual current data to identify possible bearing faults;
     generate a fault index for any identified bearing faults; and
     generate an alert if the fault index exceeds a fault index threshold.

21. The current monitoring system of claim 20 wherein the processor is further programmed to:
   analyze a plurality of generated fault indices; and
   apply a statistical process control (SPC) technique to the plurality of fault indices to set the fault index threshold.

22. The current monitoring system of claim 20 wherein the processor is further programmed to configure a Wiener filter based on the baseline current data, the Wiener filter configured to define the non-fault component from the baseline current data.

23. The current monitoring system of claim 20 wherein the processor is further programmed to calculate a root-mean square value of the residual current data to determine the fault index.

24. The current monitoring system of claim 20 wherein the processor is further programmed to detect generalized roughness bearing faults from the fault index.

* * * * *

UNITED STATES PATENT AND TRADEMARK OFFICE
CERTIFICATE OF CORRECTION

PATENT NO. : 7,777,516 B2
APPLICATION NO. : 12/132056
DATED : August 17, 2010
INVENTOR(S) : Zhou et al.

It is certified that error appears in the above-identified patent and that said Letters Patent is hereby corrected as shown below:

Col. 1, line 14 (GOVERNMENT LICENSE RIGHTS), delete "DE-FC36-04G014000" and substitute therefore -- DE-FC36-04GO14000 --.

Signed and Sealed this
Twenty-fifth Day of January, 2011

David J. Kappos
*Director of the United States Patent and Trademark Office*